US011823737B2

(12) United States Patent
Sforzin et al.

(10) Patent No.: US 11,823,737 B2
(45) Date of Patent: Nov. 21, 2023

(54) ADAPTIVE CONTROL TO ACCESS CURRENT OF MEMORY CELL DESCRIPTION

(71) Applicant: Micron Technology, Inc., Boise, ID (US)

(72) Inventors: Marco Sforzin, Cernusco sul Naviglio (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/971,053

(22) PCT Filed: May 18, 2020

(86) PCT No.: PCT/IB2020/020024
§ 371 (c)(1),
(2) Date: Aug. 19, 2020

(87) PCT Pub. No.: WO2022/234309
PCT Pub. Date: Nov. 10, 2022

(65) Prior Publication Data

US 2023/0207004 A1 Jun. 29, 2023

(51) Int. Cl.
*G11C 11/00* (2006.01)
*G11C 13/00* (2006.01)

(52) U.S. Cl.
CPC ........ *G11C 13/004* (2013.01); *G11C 13/0038* (2013.01); *G11C 13/0097* (2013.01); *G11C 2013/0054* (2013.01); *G11C 2213/71* (2013.01)

(58) Field of Classification Search
CPC .............. G11C 13/004; G11C 13/0038; G11C 13/0097; G11C 2013/0054
USPC .......................................................... 365/148
See application file for complete search history.

(56) References Cited

U.S. PATENT DOCUMENTS

| | | | | |
|---|---|---|---|---|
| 10,199,093 | B1 * | 2/2019 | Nguyen | G11C 11/419 |
| 10,692,575 | B1 * | 6/2020 | Huang | G11C 13/003 |
| 2007/0279976 | A1 | 12/2007 | Gilbert et al. | |
| 2010/0020595 | A1 | 1/2010 | Parkinson et al. | |
| 2012/0140544 | A1 | 6/2012 | Kim | |
| 2014/0078822 | A1 | 3/2014 | Vincenzo et al. | |
| 2015/0063003 | A1 * | 3/2015 | Tsukada | G11C 13/004 365/148 |
| 2016/0358651 | A1 | 12/2016 | Shih et al. | |

OTHER PUBLICATIONS

International Search Report and Written Opinion issued in PCT/IB2020/020024, dated Feb. 10, 2021 (10 pages).

* cited by examiner

*Primary Examiner* — Vu A Le
(74) *Attorney, Agent, or Firm* — Fletcher Yoder, P.C.

(57) ABSTRACT

Devices, systems and methods for adaptively controlling a reset current of a memory cell are described. A system comprises: a mirror circuit with one branch coupled with a top electrode of the memory cell and the other branch coupled with one end of a resistive reference, and wherein a bottom electrode of the memory cell is coupled to a reference potential, the other end of the resistive reference is provided with a first electric potential; a control circuit; and a feedback circuit for feeding an electric potential to the top electrode of the memory cell.

28 Claims, 8 Drawing Sheets

ADAPTIVE CONTROL TO ACCESS CURRENT OF MEMORY CELL DESCRIPTION

TECHNICAL FIELD

The following relates generally to control a memory cell and more specifically to an adaptive control to a current of a memory cell, such as a reset current.

BACKGROUND ART

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A memory device may be operated cyclically, and after a certain number of Set/Reset cycles, electrodes of a memory cell may be degraded, which may cause the electrical resistance of the memory cell to reduce. In this case, a thermal power produced by joule effect of the memory cell may drop because of the reduction of the electrical resistance of the electrodes. As is known that an amorphization process is temperature driven, and the material of the memory cell should be melted and then cooled quickly during Set/Reset operations of the memory cell. Therefore, the reduction of the thermal power of the memory cell may result in a reset problem. That is to say, the power of the memory cell should be kept substantially constant to make sure that the memory cell operates normally. To do this, it may be required to increase the reset current of the memory cell.

The present disclosure provides a solution to control a current, for example a reset current, of the memory cell.

DETAILED DESCRIPTION

Figure 1:
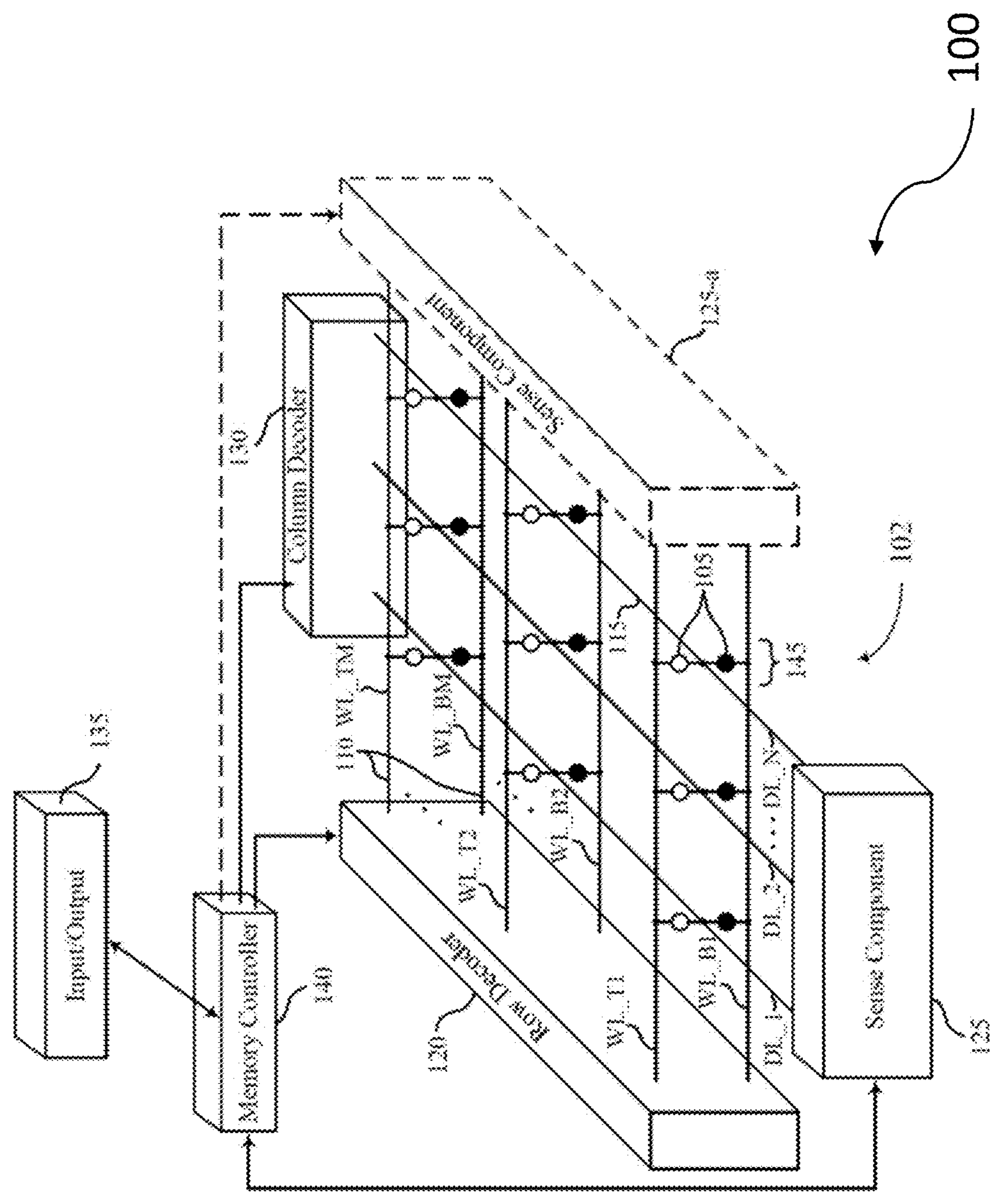
FIG. 1 illustrates an example of a memory device including memory cells in accordance with embodiments of the present disclosure.

FIG. 1 illustrates an example memory device or system 100 in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, and may not be representative of their actual physical positions within the memory device 100. In the illustrative example of FIG. 1, the memory device 100 includes a 3D memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a PCM cell (e.g., a 3DXP memory cell). Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed adjacent one another (e.g., on top of or next to one another). This may increase a number of memory cells 105 that may be placed or created on a single die or substrate as compared with 2D arrays, which in turn may reduce production costs, or increase the performance of the memory device, or both. Based on the example depicted in FIG. 1, the 3D memory array 102 includes two levels of memory cells 105; however, the number of levels may not be limited to two. Each level may be aligned or positioned such that memory cells 105 may be aligned (exactly, overlapping, or approximately) with one another across each level, forming a memory cell stack 145. In some cases, the memory cell stack 145 may include a PCM cell (e.g., 3DXP memory cell) laid on top of another.

In some embodiments, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. In other embodiments, each of the memory cell 105 (e.g., the upper memory cell, the lower memory cell) may be configured with its own bit line. In such cases, the memory cells may be separated by an insulation layer. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

Figure 2:
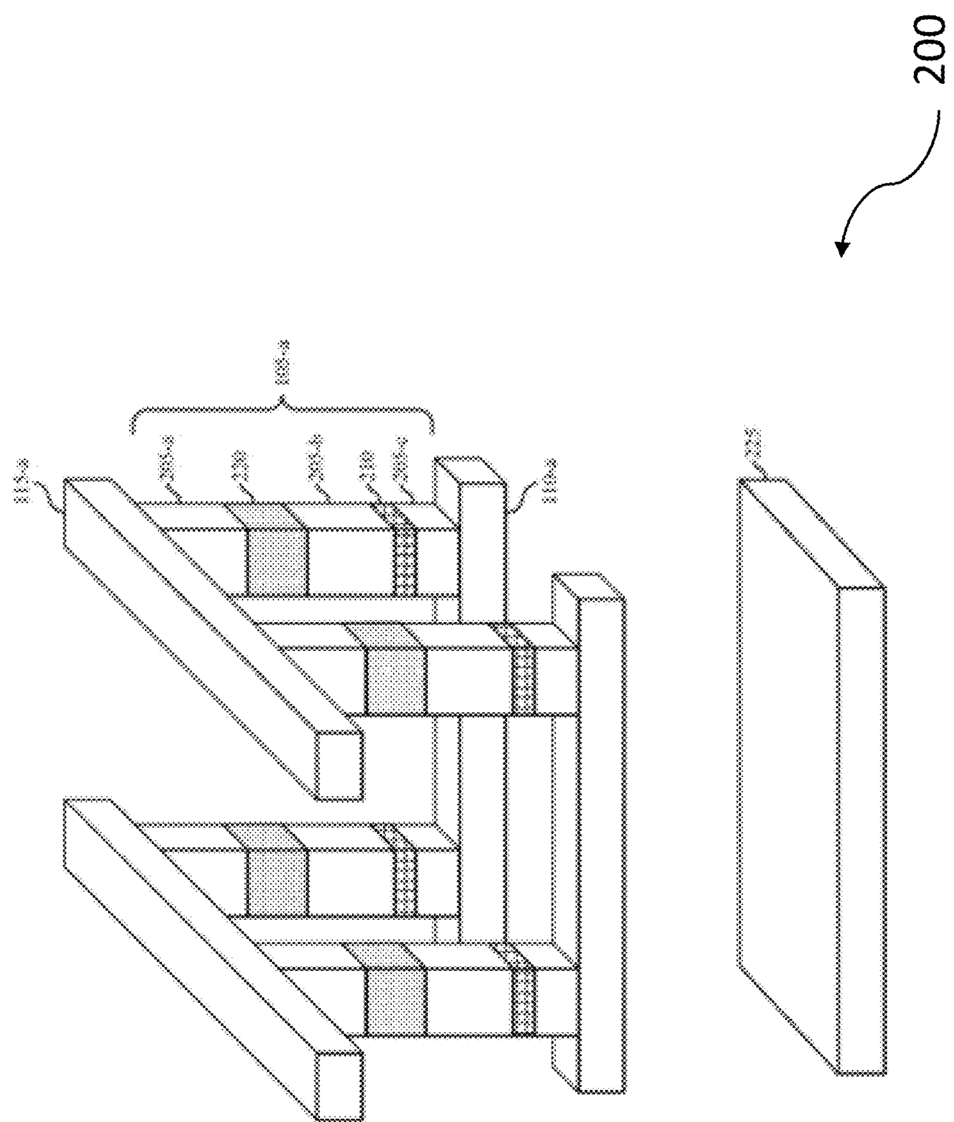
FIG. 2 illustrates an example of a 3D memory array including memory cells in accordance with embodiments of the present disclosure.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide alloy positioned between a first electrode and a second electrode. One side of the first electrode may be coupled to an access line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different. In other embodiments, the memory cell 105 may include an additional electrode to separate the chalcogenide alloy into two parts as depicted in FIG. 2. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

Operations such as reading and writing may be performed on memory cells 105 by energizing or selecting access line 110 and digit line 115. In some embodiments, access lines 110 may also be known as word lines 110, and bit lines 115 may also be known as digit lines 115. References to word lines and bit lines, or their analogues, are interchangeable without loss of understanding or operation. Energizing or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a memory cell 105 (e.g., a capacitor, a resistor) may be electrically isolated from the digit line 115 by a selection component. The word line 110 may be connected to and may control the selection component. For example, the selection component may be a transistor and the word line 110 may be connected to the gate of the transistor. Energizing the word line 110 results in an electrical connection or closed circuit between the logic storing device of a memory cell 105 and its corresponding digit line 115. The digit line 115 may then be accessed to either read or write the memory cell 105. Upon selecting a memory cell 105, the resulting signal may be used to determine the stored logic state. In some cases, a first logic state may correspond to no current or a negligibly small current, whereas a second logic state may correspond to a finite amount of current. In some cases, a memory cell 105 may include a 3DXP memory cell or a self-selecting memory (SSM) cell, both having two terminals and may not need a separate selection component. As such, one terminal of the 3DXP memory cell or the SSM cell may be electrically connected to a word line 110 and the other terminal of the 3DXP memory cell or the SSM cell may be electrically connected to a digit line 115.

Accessing memory cells 105 may be controlled through a row decoder 120 and a column decoder 130. For example, a row decoder 120 may receive a row address from the memory controller 140 and energize the appropriate word line 110 based on the received row address. Similarly, a column decoder 130 may receive a column address from the memory controller 140 and energize the appropriate digit line 115. For example, the 3D memory array 102 may include multiple word lines 110, labeled WL_B1 (or WL_T1) through WL_BM (or WL_TM), and multiple digit lines 115, labeled DL_1 through DL_N, where M and N depend on the array size. Thus, by energizing a word line 110 and a digit line 115, e.g., WL_B2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected (e.g., a memory cell 105 turns on, switches on, conducts current, or becomes activated). In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-*a* (in a dashed box). An ordinary person skilled in the art would appreciate that sense component may be associated either with column decoder or row decoder without losing its functional purposes.

A memory cell 105 may be set or written by similarly energizing the relevant word line 110 and digit line 115 and at least one logic value may be stored in the memory cell

105. Column decoder 130 or row decoder 120 may accept data, for example input/output 135, to be written to one or more memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So, the logic state may be re-written after a sense operation. Additionally, energizing a single word line 110 may result in the discharge of all memory cells 105 in the row; thus, several or all memory cells 105 in the row may need to be re-written. But in non-volatile memory, such as SSM, PCM (e.g., 3DXP memory), FeRAM, or 3D NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to energize the desired word line 110 and digit line 115. Memory controller 140 may also generate and control various voltages or currents used during the operation of memory device 100.

The memory controller 140 may receive user data through the input/output 135. In some embodiments, the memory controller 140 may read a previous user data from the memory cells and write a new user data and merge the new user data with the previous user data into write registers. Then, a mask register (MR) information may be generated, and wherein the mask register information may indicate bits of the previous user data stored in the memory cells to be switched or not to be switched in their logic values. In some embodiments, the memory controller 140 may count numbers of a first logic value (logic “0”) and a second logic value (logic “1”) to be written using the MR information, respectively, and store the numbers of the first logic value and the second logic value into a first counter and a second counter, respectively. In some embodiments, the memory controller 140 may apply a programming pulse to the memory cells according to the mask register information.

In general, the amplitude, shape, polarity, and/or duration of an applied voltage or current discussed herein may be adjusted or varied and may be different for the various operations discussed in operating the memory device 100. For example, during an access operation, such as a reset operation, a set operation and/or a read operation, a current and/or a voltage may be adaptively controlled. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

FIG. 2 illustrates an example of a memory array 200 that supports adaptive current control in accordance with embodiments of the present disclosure. Memory array 200 may be an example of portions of memory array 102 described with reference to FIG. 1. As depicted in FIG. 2, memory array 200 includes multiple materials to construct a memory cell 105-*a*. Each memory cell 105-*a* is stacked in a vertical direction (e.g., perpendicular to a substrate) to create memory cell stacks (e.g., the memory cell stack 145). The memory cell 105-*a* may be an example of a memory cell 105 described with reference to FIG. 1. Memory array 200 may thus be referred to as a 3D memory array. The architecture of memory array 200 may be referred to as a cross-point architecture. Although some elements included in FIG. 2 are labeled with a numeric indicator, other corresponding elements are not labeled, though they are the same or would be understood to be similar, in an effort to increase visibility and clarity of the depicted features.

Memory array 200 also includes word lines 110-*a* and bit lines 115-*a*, which may be examples of word line 110 and bit line 115 described with reference to FIG. 1. Illustration of the materials between the word lines 110-*a* and the bit lines 115-*a* depicted in FIG. 2 may represent a lower portion of the memory cell 105 in FIG. 1. Memory array 200 includes electrodes 205, logic storage elements 210, selector device elements 220, and a substrate 225. In some examples, a single component including a chalcogenide alloy (not shown, replacing selector device element 220, logic storage element 210, and electrode 205-*b*) may act as both a logic storage element and a selector device. Electrode 205-*a* may be in electronic communication with bit line 115-*a* and electrode 205-*c* may be in electronic communication with word line 110-*a*.

Insulating materials depicted as empty spaces may be both electrically and thermally insulating. As described above, in PCM technology, various logic states may be stored by varying the electrical resistance of the logic storage element 210 in memory cells 105-*a*, which in turn exhibiting varying threshold voltages of the memory cells 105-*a*. In some cases, storing various logic states includes passing a current through the memory cell 105-*a*, heating the logic storage element 210 in memory cell 105-*a*, or melting (e.g., wholly or partially) the material of the logic storage element 210 in memory cell 105-*a*. Other storage mechanisms, such as threshold voltage modulation, may be exploited in chalcogenide-based memories.

In some cases, memory array 200 may include an array of memory cell stacks, and each memory cell stack may include multiple memory cells 105-*a*. Memory array 200 may be made by forming a stack of conductive materials, such as word lines 110-*a*, in which each conductive material is separated from an adjacent conductive material by electrically insulating materials in between. The electrically insulating materials may include oxide or nitride materials, such as silicon oxide, silicon nitride, or other electrically insulating materials. These materials may be formed above the substrate 225, such as a silicon wafer, or any other semiconductor or oxide substrate. Subsequently, various process steps may be utilized to form the materials in between the word lines 110-*a* and bit lines 115-*a* such that each memory cell 105-*a* may be coupled with a word line 110-*a* and a bit line 115-*a*.

The selector device element 220 may be connected with the logic storage element 210 through electrode 205-*b*. In some examples, the positioning of the selector device element 220 and the logic storage element 210 may be flipped. The composite stack including the selector device element 220, the electrode 205-*b*, and the logic storage element 210 may be connected to a word line 110-*a* through the electrode 205-*c* and to a bit line 115-*b* through the electrode 205-*a*. The selector device element 220 may aid in selecting a particular memory cell 105-*a* or may help prevent stray currents from flowing through non-selected memory cells 105-*a* adjacent to a selected memory cell 105-*a*. The selector device element 220 may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device element includes a chalcogenide alloy. The selector device, in some examples, include an alloy of selenium (Se), arsenic (As), silicon (Si), and germanium (Ge).

As discussed above, memory cells 105-*a* of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Many chalcogenide alloys may be possible—for example, a germanium-antimony-tellurium alloy (Ge—Sb—Te) is a chalcogenide material. Other chalcogenide alloys not expressly recited here may also be employed.

To set a low-resistance state, a memory cell 105-*a* may be heated by passing a current through the memory cell 105-*a*. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-*a* may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

In some cases, memory cells 105-*a* may exhibit different electrical characteristics after a number of cycling operations (e.g., a series of read or write operations). For example, a threshold voltage of a memory cell 105-*a* (e.g., PCM cell) corresponding to a logic state of 1, after receiving an identical programming pulse to store the logic state of 1 (e.g., a SET programming pulse), may be different if a memory cell 105-*a* is relatively new (e.g., a PCM cell with a small number of read or write operations) compared to a memory cell 105-*a* having been cycled through an extensive number of read or write operations. In addition, in some cases, a chalcogenide material in the memory cells 105-*a* (e.g., the logic storage element 210) may experience a change (which may also be referred to as a drift) in its resistance after programming (e.g., crystallizing or quenching) of the chalcogenide material during a write operation. Such change in resistance may result in changes in threshold voltages of memory cells 105-*a* and may hinder accurately reading information from memory cells 105-*a* (e.g., PCM cells) after a certain period of time elapsed. In some embodiments, the amount of change may be a function of an ambient temperature.

In some embodiments, the memory cells 105-*a* may be configured to store encoded user data that include modified user data (or original user data, in some cases) and a number of parity bits, which may be added thereto. In some cases, the encoded user data stored in the memory cells 105-*a* have been modified to include a predetermined number of bits having the logic state of 1. The number of bits having the logic state of 1 may be different depending on encoding scheme employed. In some cases, the number of bits having the logic state of 1 may be 50% (or other percentage) of the bits containing the encoded user data. In some embodiments, the memory cells 105-*a* may be configured to store user data while an additional set of memory cells 105-*a* is configured to store a counting information. The counting information may represent a number of bits in the user data having the logic state of 1. In some cases, the counting information may be read in advance to extract the number of bits in the user data having the logic state of 1 before the user data are read. Additionally or alternatively, the counting information may be determined while the user data are being read.

According to embodiments of the present disclosure it will be detailed hereinafter a system for adaptively controlling a reset current of a memory cell and this system will be disclosed in detail starting from the examples of FIG. 3 and the following.

The system of the present disclosure is applied to the memory array and memory device of the previous Figures.

Therefore, embodiments of the present disclosure relate to a memory device including a system for adaptively controlling a current of a memory cell (for example, a reset current), comprising:

- a detector of a voltage drop between a bit line and a word line coupled to a memory cell;
- a differential cell including a current mirror for reproducing the current crossing the memory cell on a resistive reference;
- a control circuit configured to operate on a voltage value correlated to said current crossing the memory cell;
- a feedback circuit portion for feeding to memory cell with a feedback voltage keeping constant the cell power independently from the value of the current crossing the memory cell.

More particularly, said resistive reference has a resistance value smaller—in some cases, much smaller—than an electrical resistance of the memory cell. In other words, the current mirror may reproduce the current flowing through the memory cell on a resistive reference. Similarly, the feedback circuit may feed the memory cell with a feedback voltage keeping constant the cell power independently from the a value of the current flowing through the memory cell.

Figure 3:
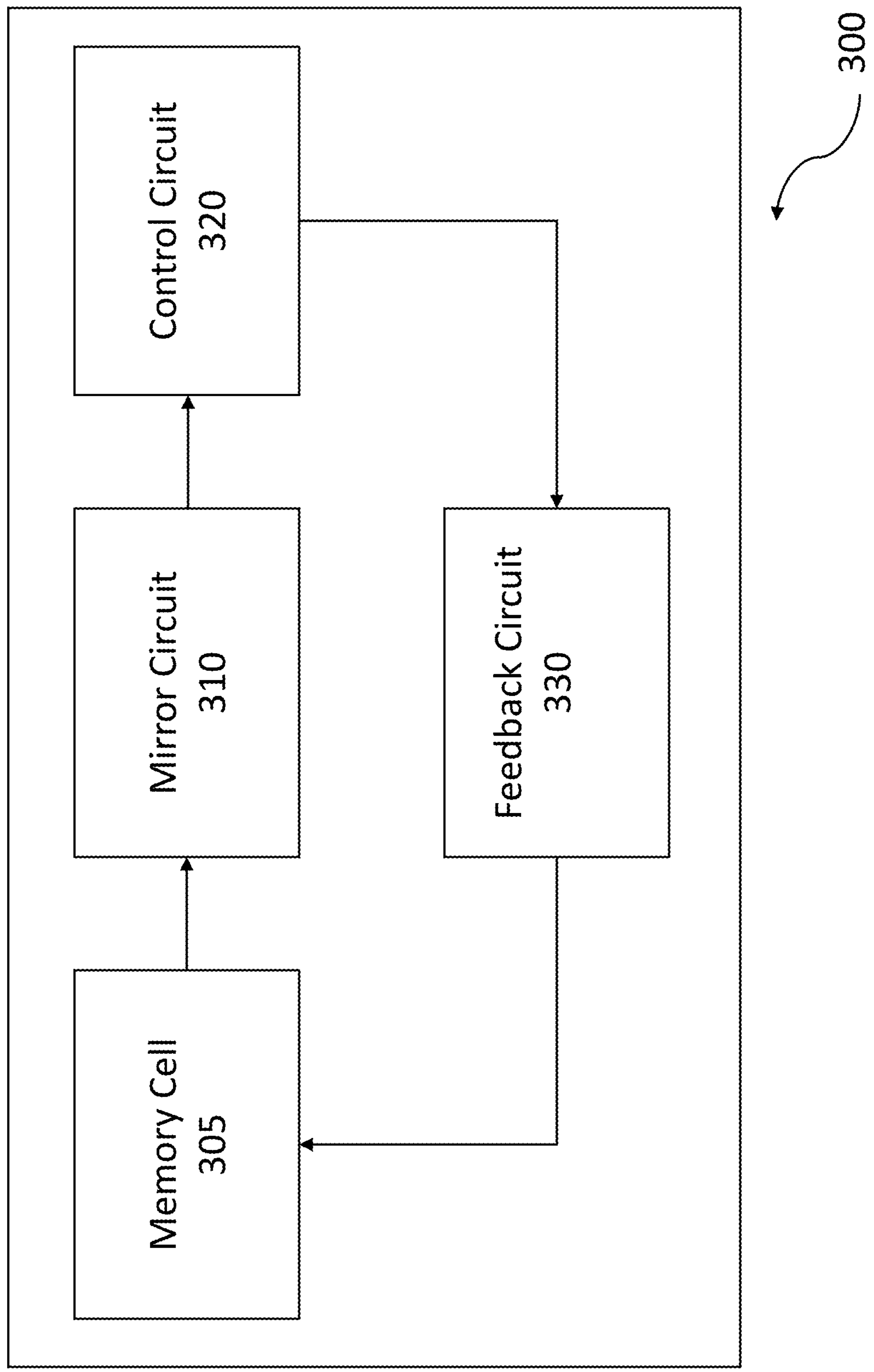
FIG. 3 illustrates an example of a system for adaptively controlling the reset current of a memory cell in accordance with embodiments of the present disclosure.

FIG. 3 illustrates an example of a system 300 for adaptively controlling a current of a memory cell 305 in accordance with embodiments of the present disclosure. Without limitation and for sake of clearness and simpler presentation, the following description will consistently refer to a reset current through a memory cell, e.g., during a reset operation; however, it is to be understood that other currents, e.g., a read and/or a set current, may be adaptively controlled without departing from the scope of the claims. The memory cell 305 may be the memory cell 105 described in FIGS. 1 and 2. In one embodiment of the present disclosure, the memory cell 305 may include a top electrode and a bottom electrode, which are coupled with a word line and a bit line, respectively (or vice-versa). In particular, the top electrode of the memory cell 305 may be coupled with the word line, and the bottom electrode of the memory cell 305 may be coupled with the bit line. In a set/reset operation of the memory cell 305, the memory material may be subjected to a crystallization/amorphization process which is a temperature driven process. In the amorphization process, the material of the memory cell 305 must be first melted and then cooled quickly. In order to make sure that the memory cell 305 operates well, it may be required to keep the thermal power of the memory cell 305 substantially constant in the reset operation of the memory cell 305. In other words, after a certain number of set/reset cycles of the memory cell 305, it may be required to increase the reset current of the memory cell 305 because of the reduction of the electrical resistance of the electrodes of the memory cell 305, which may degrade as the memory cell 305 operates cyclically. Similar effects may occur during a set and/or read operation after cycling.

The system 300 proposed herein disclosed may be used to adaptively control the reset current of the memory cell 305. According to the system 300, it may be possible to automatically calibrate the reset (or set) current based on an actual resistance capable of producing the joule effect and therefore compensate for the reduction of the resistance of the electrode induced by cycling.

In one embodiment of the present disclosure, the system 300 may comprise a mirror circuit 310, a control circuit 320, and a feedback circuit 330. According to the embodiment of the present disclosure, the mirror circuit 310 may be configured to replicate the reset current of the memory cell 305 to a resistive reference, which is shown as the resistive reference 444 in FIG. 4 and will be described below. In one embodiment of the present disclosure, the resistive reference is provided with a first electric potential. The mirror circuit 310 may be further configured to provide a second electric potential related to the reset current to the control circuit 320. Specifically, the second electric potential may be provided to a drain of a first NMOS (N-Channel Metal-Oxide-Semiconductor) transistor of the control circuit 320. In one embodiment of the present disclosure, the control circuit 320 may further include a current source for providing an input current to the drain of the first NMOS transistor. In one embodiment of the present disclosure, the current source may be further configured to provide a third electric potential to a gate of the first NMOS transistor. According to the embodiment of the present disclosure, the feedback circuit 330 may be configured to feed the third electric potential on the gate of the first NMOS transistor back to the memory cell 305. Specifically, the third electric potential may be provided to the top electrode of the memory cell 305.

In one embodiment of the present disclosure, the mirror circuit may include one branch coupled with the top electrode of the memory cell 305 and the other branch coupled with one end of the resistive reference. In one embodiment of the present disclosure, the bottom electrode of the memory cell 305 may be coupled to a reference potential, for instance to a ground. In one embodiment of the present disclosure, the other end of the resistive reference may be provided with the first electric potential, and the resistive reference may have a constant resistance much smaller than the electrical resistance of the memory cell 305. In one embodiment of the present disclosure, the source of the first NMOS transistor may be provided with the first electric potential.

According to the embodiment of the present disclosure, the first NMOS transistor may be configured to operate in a linear region. In this case, the input current from the current source may be configured to be equal to a drain current of the first NMOS transistor operating in the linear region. According to the system 300 with the configuration mentioned above, the system 300 may be able to increase the reset current of the memory cell 305 as the electrodes of the memory cell 305 degrade with cycling. Although the electrical resistance of the memory cell 305 may reduce as the electrodes degrade, the reset current of the memory cell 305 may be increased so that the power of the memory cell 305 may be kept substantially constant. Therefore, a reset problem of the memory cell 305 due to the reduction of the electrical resistance of the electrodes may be addressed. It should be noted that the electrical resistance of the memory cell 305 described in the present disclosure may comprise the electrical resistance of the electrodes (e.g., the top electrode and the bottom electrode) in addition to the electrical resistance of the material of the memory cell 305.

Figure 3A:
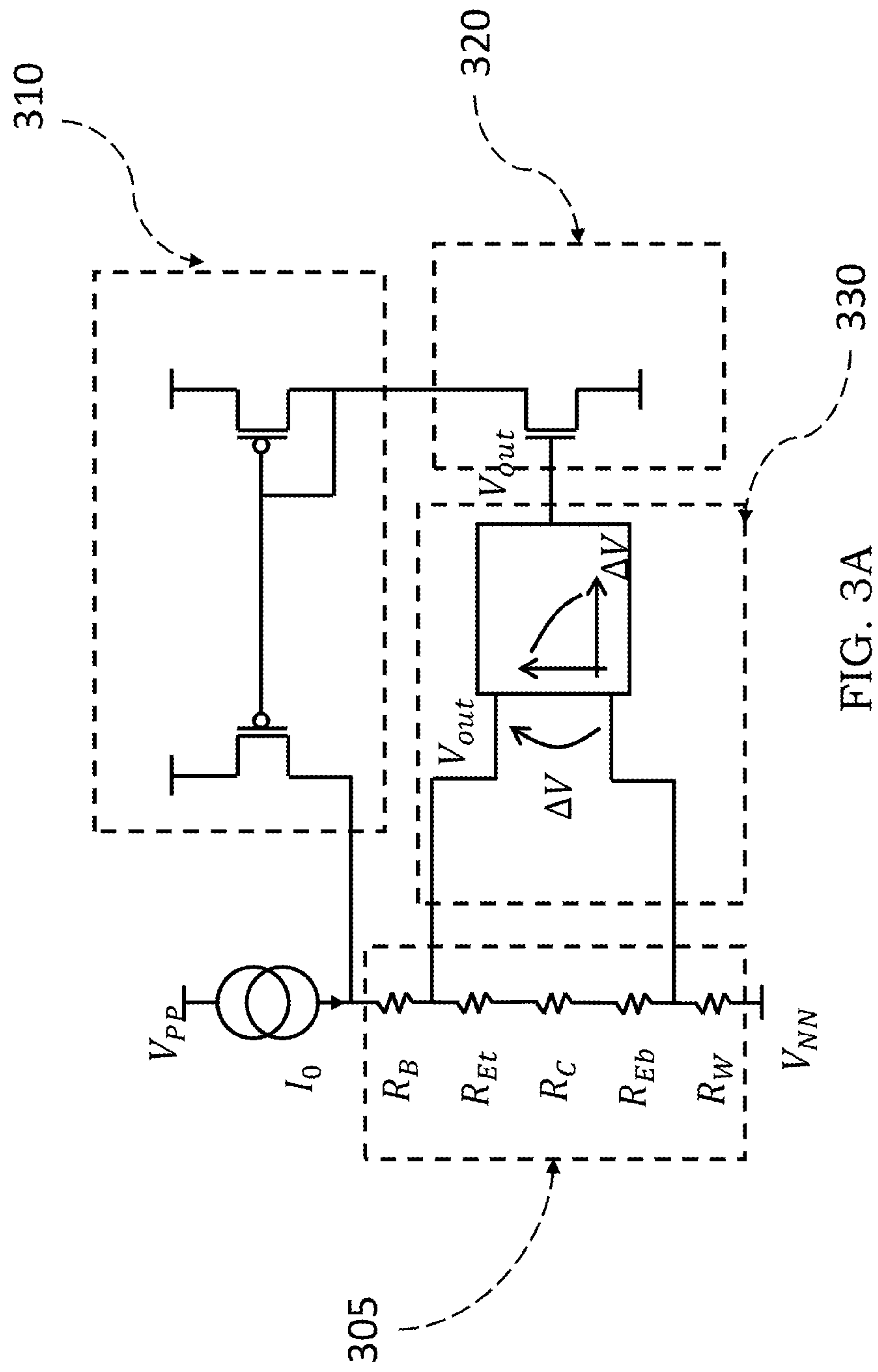
FIG. 3A illustrates a schematic example of a circuit diagram of the system of FIG. 3 for adaptively controlling the reset current of a memory cell in accordance with embodiments of the present disclosure.

FIG. 3A illustrates a schematic example of a possible implementation of the system 300 of FIG. 3. In this example the memory cell 305 is represented as a voltage divider including a plurality of resistive contributions. The other functional block of FIG. 3 have been reported in this FIG. 3A as structured in a schematic circuit diagram.

We may identify a contribution Rc given by the resistive value of the active material, for instance the chalcogenide alloy, then the top and bottom electrodes are represented by their respective resistive values Ret and Reb; finally, the top bit line and the bottom word line are indicated by their respective resistive values Rb and Rw.

The present disclosure proposes to adaptively control the current, e.g., the reset current, on the basis of a joule effect reduction. In other words, since the reduction is dependent to a resistive value, a measure of the joule effect reduction is performed by monitoring the voltage drop across the memory cell, including its electrodes, that is to say; the voltage between the bit line and the word line.

In embodiments of the present disclosure it is proposed to close a loop in defining the reset current by measuring its effect on the memory cell. A principle scheme may be the following: If the voltage drop $\Delta V$ decreases, Vout increases and a contribution of current is injected in the cell.

The loop must be designed in order to conserve the power in the cell during the pulse so to reach the same temperature value.

Figure 4:
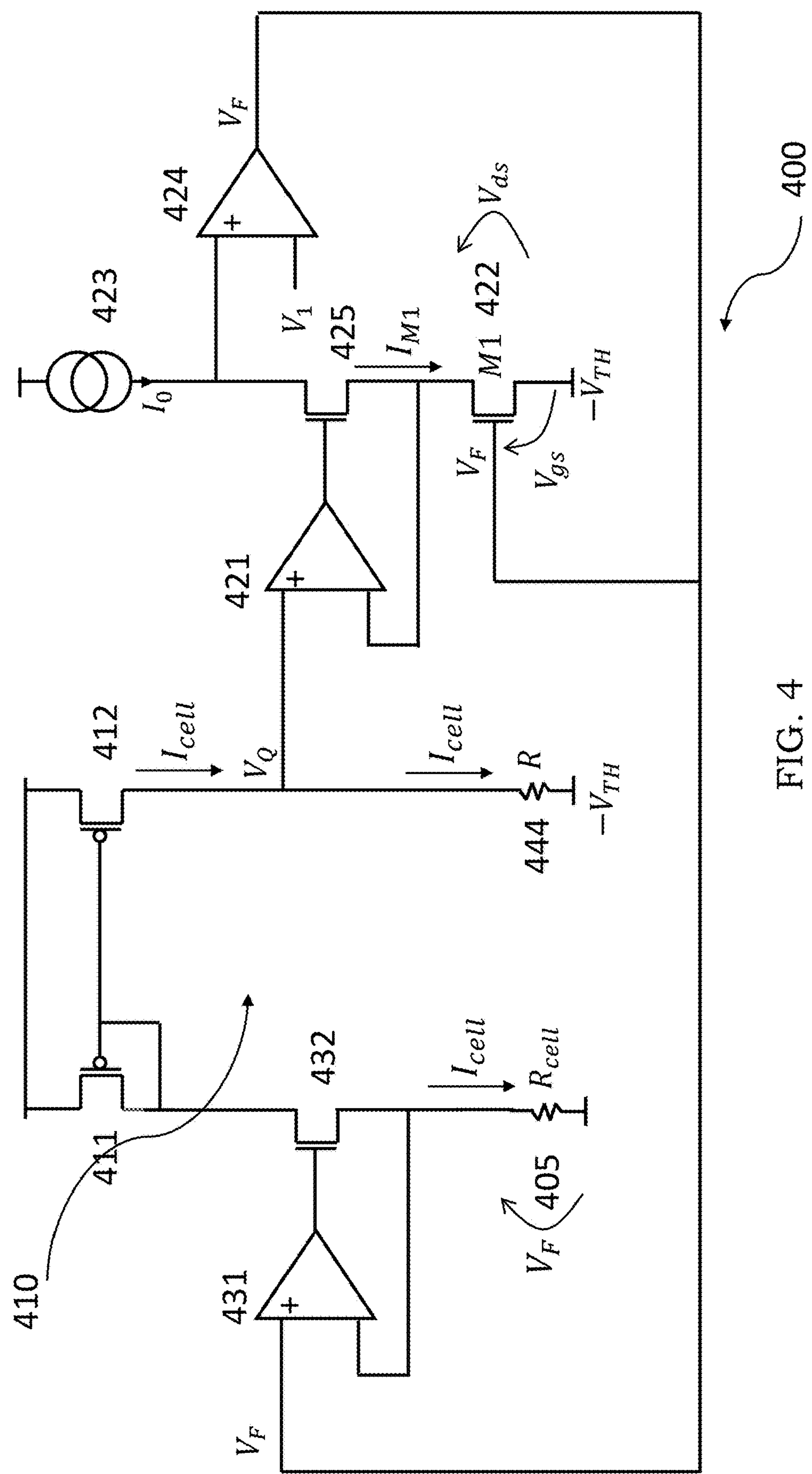
FIG. 4 illustrates an example of a circuit diagram of the system for adaptively controlling the reset current of a memory cell in accordance with embodiments of the present disclosure.

FIG. 4 illustrates an example of a circuit diagram 400 of the system 300 for adaptively controlling the reset current of a memory cell 305 in accordance with embodiments of the present disclosure. It should be noted that the memory cell 305 is shown as a cell resistor 405, and the electrical resistance $R_{cell}$ of the cell resistor 405 may be equal to the electrical resistance of the memory cell 305 as described above. In one embodiment of the present disclosure, a differential cell 410 includes a first MOS transistor 411 and a second MOS transistor 412 that together may form the mirror circuit 310 shown in FIG. 3. In the embodiment of the present disclosure, a first source of the first MOS transistor 411 and a second source of the second MOS transistor 412 may be coupled together to a fourth electric potential (not shown), a first gate of the first MOS transistor 411 may be coupled with a first drain of the first MOS transistor 411 and a second gate of the second MOS transistor 412, the first drain of the first MOS transistor 411 may be coupled with one end of the cell resistor 405 (i.e., the top electrode of the memory cell 305), and a second drain of the second MOS transistor 412 may be coupled with one end of the resistive reference 444. In one embodiment of the present disclosure, the other end of the resistive reference 444 may be provided with the first electric potential $-V_{TH}$. In one embodiment of the present disclosure, the other end of the cell resistor 405 (i.e., the bottom electrode of the memory cell 305) may be coupled with a ground.

In another embodiment of the present disclosure, the mirror circuit may be a cascaded mirror circuit with four MOS transistor cascaded with each other in order to increase an accuracy of controlling the reset current of the memory cell 305. According to the embodiment of the present disclosure, a first source of a first MOS transistor and a second source of a second MOS transistor may be coupled together to a fourth electric potential, a first gate of the first MOS transistor may be coupled with a first drain of the first MOS transistor and a second gate of the second MOS transistor, the first drain of the first MOS transistor may be coupled with a third source of a third MOS transistor, a second drain of the second MOS transistor may be coupled with a fourth source of a fourth MOS transistor, a third gate of the third MOS transistor may be coupled with a third drain of the third MOS transistor and a fourth gate of the fourth MOS transistor, the third drain of the third MOS transistor may be coupled with the one end of the cell resistor 405 (i.e., the top electrode of the memory cell 305), and a fourth drain of the fourth MOS transistor may be coupled with the one end of the resistive reference 444. In one embodiment of the present disclosure, the other end of the resistive reference 444 may be provided with the first electric potential $-V_{TH}$. In one embodiment of the present disclosure, the other end of the cell resistor 405 (i.e., the bottom electrode of the memory cell 305) may be coupled with a ground. Although the arrangement of the first through fourth MOS transistors is not shown, those skilled in the art can make it according to the description mentioned above.

In one embodiment of the present disclosure, the MOS transistors forming the mirror circuit may be PMOS transistors. However, other components may be possible only if they can replicate the reset current passing the memory cell 305.

According to the embodiment of the present disclosure, the electrical resistance R of the resistive reference 444 may be a constant value, which is much smaller than the electrical resistance $R_{cell}$ of the cell resistor 405 (i.e., the electrical resistance of the memory cell 305).

In one embodiment of the present disclosure, the control circuit 320 may include: a first operational amplifier 421 having a first input coupled with one end of the differential cell 410, i.e. the drain terminal of the resistive reference 444, a second input coupled with the drain of the first NMOS transistor 422, and a first output coupled with a gate of a switching transistor 425; the switching transistor 425 having a drain coupled with an output of the current source 423 and a source coupled with the second input of the first operational amplifier 421; and a second operational amplifier 424 having a third input coupled with the output of the current source 423, a fourth input provided with a fifth electric potential (Vi), and a second output coupled with the gate of the first NMOS transistor 422. In the embodiment of the present disclosure, the switching transistor 425 may be an NMOS transistor. In the embodiment of the present disclosure, the source of the first NMOS transistor 422 may be provided with the first electric potential $-V_{TH}$.

In one embodiment of the present disclosure, the first operational amplifier may be configured to provide the second electric potential on the one end of the resistive reference 444 to the drain of the first NMOS transistor 422.

In one embodiment of the present disclosure, the feedback circuit 330 may include a third operational amplifier 431 with a first input coupled with the gate of the first NMOS transistor 422, a second input coupled with the one end of the cell resistor 405 (i.e., the top electrode of the memory cell 305), and an output coupled with the one branch of the mirror circuit. Specifically, the output of the third operational amplifier 431 may be coupled with a gate of a transistor 432, a drain of the transistor 432 may be coupled with the one branch of the mirror circuit, and a source of the transistor 432 may be coupled with the one end of the cell resistor 405 (i.e., the top electrode of the memory cell 305). In the embodiment of the present disclosure, the drain of the transistor 432 may be coupled with the first drain of the first MOS transistor 411. In the embodiment of the present disclosure, the transistor 432 may be an NMOS transistor. According to the embodiment of the present disclosure, the third operational amplifier 431 may be configured to provide the third electric potential ($V_F$) on the gate of the first NMOS transistor 422 to the one end of the cell resistor 405 (i.e., the top electrode of the memory cell 305).

Some aspects and working principles will be described in detail with reference to related formulas.

The mirror circuit 310 may be configured to replicate the current passing the memory cell 305 to the resistive reference 444 such that the second electric potential $V_Q$ on the one end of the resistive reference 444 may meet:

$$V_Q=RI_{cell}V_{TH}.$$

Therefore, the system of the present disclosure detects a voltage drop between the bit line and word line coupled to a selected cell.

Embodiments of the present disclosure relates to a system for adaptively controlling a reset current of a memory cell, comprising:

- a mirror circuit with one branch coupled with a top electrode of the memory cell and the other branch coupled with one end of a resistive reference, and
- wherein a bottom electrode of the memory cell is coupled to a reference potential, the other end of the resistive reference is provided with a first electric potential;
- a control circuit; and
- a feedback circuit for feeding an electric potential to the top electrode of the memory cell.

The first operational amplifier 421 may be configured to provide the second electric potential $V_Q$ to the drain of the first NMOS transistor 422 such that a drain-source voltage $V_{ds}$ of the first NMOS transistor 422 may meet:

$$V_{ds}=V_Q+V_{TH}.$$

The second operational amplifier 424 may be configured to provide the third electric potential $V_F$ to the gate of the first NMOS transistor 422 such that a gate-source voltage $V_{gs}$ of the first NMOS transistor 422 may meet:

$$V_{gs}=V_F+V_{TH}.$$

This third electric potential $V_F$ will also identified as the feedback voltage generated by the feedback circuit.

It should be noted that the first NMOS transistor 422 is configured to operate in a linear region according to the embodiment of the present disclosure. It is known that a drain current $I_{M1}$ of the first NMOS transistor 422 operating in the linear region meets:

$$I_{M1}=k\frac{W}{L}\left[(V_{gs}-V_{TH})V_{ds}-\frac{V_{ds}^2}{2}\right].$$

Wherein the parameter k is an intrinsic conductivity factor of the first NMOS transistor 422, and the parameter W/L is an aspect ratio of the first NMOS transistor 422.

The third operational amplifier 431 may be configured to provide the third electric potential $V_F$ on the gate of the first NMOS transistor 422 to the one end of the cell resistor 405 (i.e., the top electrode of the memory cell 305) such that the third electric potential $V_F$ on the top electrode of the memory cell 305 may meet:

$$V_F=R_{cell}I_{cell}.$$

The power in the memory cell 305 meets $P_{cell}=V_F I_{cell}=R_{cell} I_{cell}^2$.

Accordingly, the drain current $I_{M1}$ of the first NMOS transistor can also be calculated as:

$$I_{M1} = k\frac{W}{L}\left[V_F R I_{cell} - \frac{R^2 I_{cell}^2}{2}\right] = k\frac{W}{L}\left[RP_{cell} - \frac{RP_{cell}}{2R_{cell}}\right] = k\frac{W}{L}RP_{cell}\left(1 - \frac{R}{2R_{cell}}\right).$$

It should be also noted that the electrical resistance R of the resistive reference 444 is much smaller than the electrical resistance $R_{cell}$ of the memory cell 305, and the input current $I_0$ from the current source 423 is kept equal to the drain current $I_{M1}$ of the first NMOS transistor 422. Therefore, the following formula can be obtained:

$$I_0 = I_{M1} = k\frac{W}{L}RP_{cell}\left(1 - \frac{R}{2R_{cell}}\right) \approx k\frac{W}{L}RP_{cell}, \text{ wherein } R \ll R_{cell}.$$

Hence, $$P_{cell} = \frac{I_0}{k\frac{W}{L}R}.$$

Thus, the power $P_{cell}$ can be tuned by setting $I_0$. Since $P_{cell}=R_{cell} I_{cell}^2$, the following formula can be obtained:

$$I_{cell} = \sqrt{\frac{I_0}{k\frac{W}{L}RR_{cell}}}.$$

It can be seen from above that the power $P_{cell}$ is independent from the electrical resistance $R_{cell}$ of the memory cell 305.

Therefore, the reset current of the memory cell 305 may increase as the electrical resistance $R_{cell}$ of the memory cell 305 decreases according to some embodiments. In other words, the power $P_{cell}$ in the memory cell 305 may be kept substantially constant during reset operations of the memory cell 305 according to some embodiments. According to some embodiments, it may be possible to automatically calibrate the reset current based on an actual resistance capable of producing the joule effect and therefore compensate for the reduction of the resistance of the electrode induced by cycling.

Figure 5:
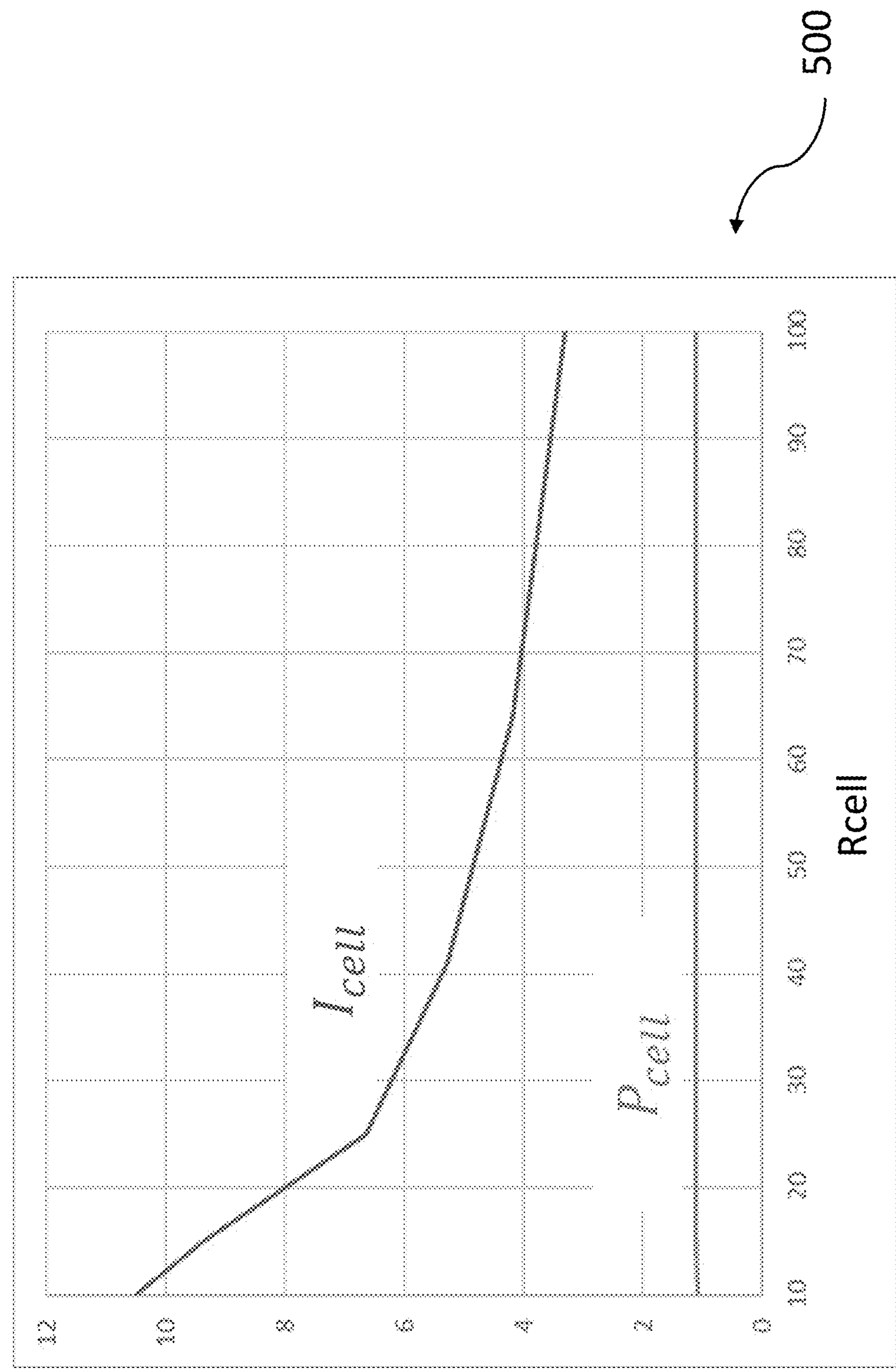
FIG. 5 illustrates an example of a simulation result of the system for adaptively controlling the reset current of a memory cell in accordance with embodiments of the present disclosure.

FIG. 5 illustrates an example of a simulation result 500 of the system 300 for adaptively controlling the reset current of a memory cell 305 in accordance with embodiments of the present disclosure.

As can be seen from the simulation result, when the input current is set, the current passing the memory cell 305 may increase (upper curve) as the electrical resistance $R_{cell}$ of the memory cell 305 decreases (resistance values represented on horizontal axis). In the meantime, the power $P_{cell}$ in the memory cell 305 may be kept substantially constant (bottom curve) during reset operations of the memory cell 305.

Figure 6:
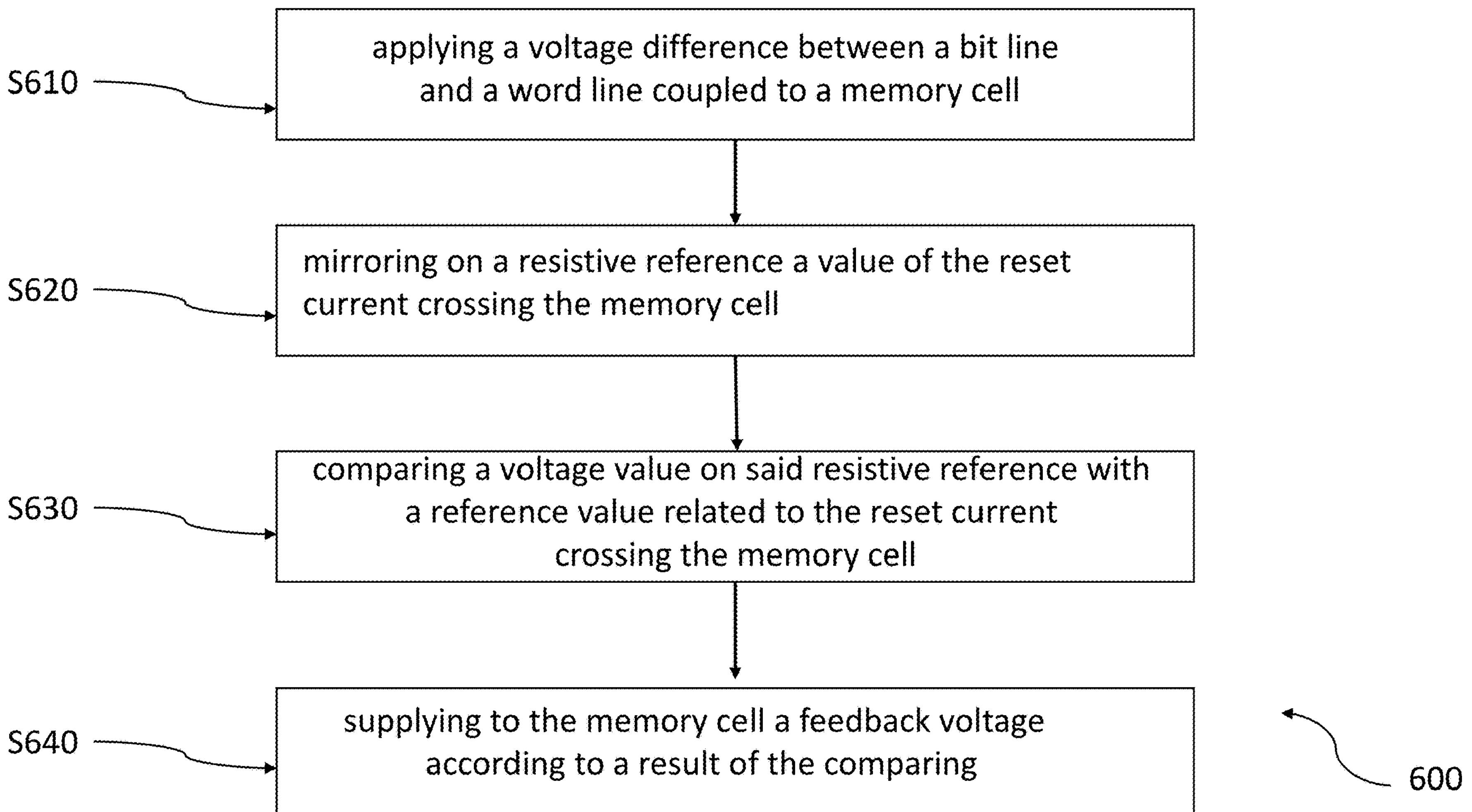
FIG. 6 illustrates a flow chart of a method for adaptively controlling the reset current of a memory cell in accordance with embodiments of the present disclosure.

FIG. 6 illustrates a flow chart of a method 600 for adaptively controlling the reset current of a memory cell 305 in accordance with embodiments of the present disclosure. The operations of method 600 may be implemented by one or more controllers associated with the memory cell 305. In some examples, one or more controllers may execute a set of instructions to control one or more functional elements to perform the described functions. Additionally or alternatively, one or more controllers may perform aspects of the described functions using special-purpose hardware.

At S610, method 600 may include applying a voltage difference between a bit line and a word line coupled to a memory cell. Based on the applying phase, a current flows through the memory cell or, in other words, the current crosses the memory cell. In some examples, applying occurs during an access operation to the memory cell, such as a reset operation.

Method 600 may include, at step S620 mirroring on a resistive reference a value of the current (e.g., the reset current) crossing the memory cell. Mirroring may be implemented by mirror circuit 310, in some examples.

Method 600 may comprise, at step S630, comparing a voltage value on said resistive reference with a reference value. This reference value may be related to the reset current crossing or flowing through the memory cell.

Method 600 may further comprise, at step S640, supplying to the memory cell a feedback voltage according to the result of the comparing.

According to embodiment of the present disclosure the value of the resistive reference is smaller—in some cases, much smaller—than the resistive value of the memory cell.

Morevover, the cell power is kept constant independently from the current crossing the memory cell, e.g., flowing through the memory cell.

Therefore, the phase S640 of supplying to the memory cell a feedback voltage corresponds substantially to feed a reset extra current according to result of the comparison phase.

Figure 7:
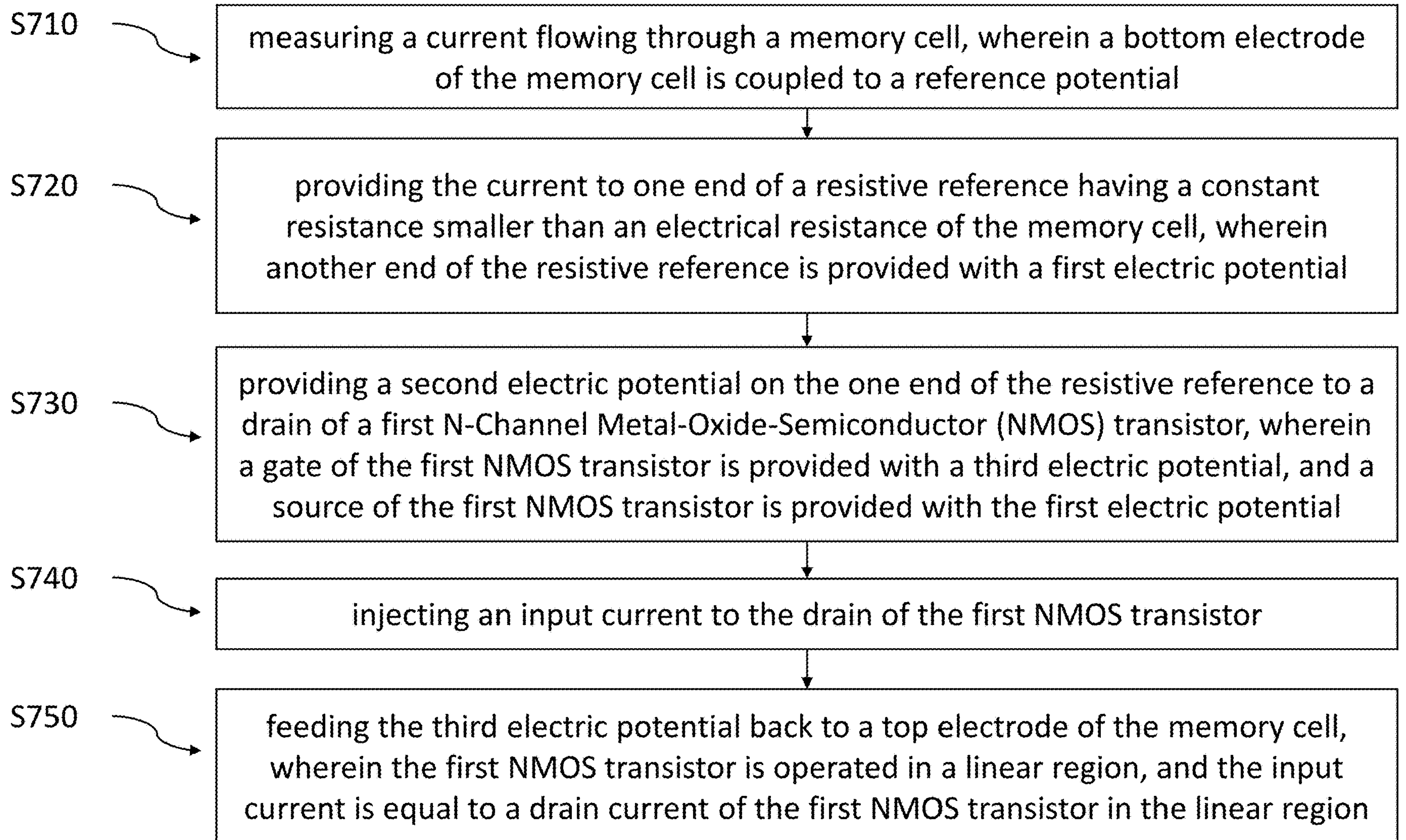
FIG. 7 illustrates a further flow chart of a method for adaptively controlling the reset current of a memory cell in accordance with embodiments of the present disclosure.

FIG. 7 illustrates a flow chart of a method 700 for adaptively controlling a current of a memory cell 305 in accordance with embodiments of the present disclosure. In some cases, the current may be a reset current; in other cases, the current may be a set or a read current. The operations of method 700 may be implemented by one or more controllers associated with the memory cell 305. In some examples, one or more controllers may execute a set of instructions to control one or more functional elements to perform the described functions. Additionally or alternatively, one or more controllers may perform aspects of the described functions using special-purpose hardware.

At S710, method 700 may include measuring a current flowing through the memory cell, wherein a bottom electrode of the memory cell is coupled to a reference potential, for instance to a ground. The operations of S710 may be performed according to the method described herein.

At S720, method 700 may include providing the reset current to one end of a resistive reference having a constant resistance smaller than an electrical resistance of the memory cell, wherein the other end of the resistive reference is provided with a first electric potential. The operations of S720 may be performed according to the method described herein.

At S730, method 700 may include providing a second electric potential on the one end of the resistive reference to a drain of a first NMOS (N-Channel Metal-Oxide-Semiconductor) transistor, wherein a gate of the first NMOS transistor is provided with a third electric potential, and a source of the first NMOS transistor is provided with the first electric potential. The operations of S730 may be performed according to the method described herein.

At S740, method 700 may include injecting an input current to the drain of the first NMOS transistor. The operations of S740 may be performed according to the method described herein.

At S750, method 700 may include feeding the third electric potential back to a top electrode of the memory cell, wherein the first NMOS transistor is operated in a linear region, and the input current is equal to a drain current of the first NMOS transistor in the linear region. The operations of S750 may be performed according to the method described herein.

In one embodiment of the present disclosure, the top electrode of the memory cell may be coupled with a word line, and the bottom electrode of the memory cell is coupled with a bit line. In one embodiment of the present disclosure, the reset current of the memory cell may increase as the electrical resistance of the memory cell decreases. In one embodiment of the present disclosure, a power in the memory cell may be kept substantially constant during reset operations of the memory cell.

According to method 700 disclosed herein, it may be possible to automatically calibrate the reset current based on an actual resistance capable of producing the joule effect and therefore compensate for the reduction of the resistance of the electrode induced by cycling.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "ground" refers to a node of an electrical circuit that is held at a voltage of approximately zero volts (0 V), or more generally represents a reference voltage of the electrical circuit or device including the electrical circuit, which may or may not be directly coupled with ground. Accordingly, the voltage of a ground may temporarily fluctuate and return to approximately 0 V, or virtual 0 V, at steady state. A ground may be implemented using various electronic circuit elements, such as a voltage divider consisting of operational amplifiers and resistors. Other implementations are also possible. "grounding" or "grounded" means connected to approximately 0 V, or some other reference voltage of a device.

The term "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "terminal" need not suggest a physical boundary or connection point of a circuit element. Rather, "terminal" may refer to a reference point of a circuit relevant to the circuit element, which may also be referred to as a "node" or "reference point".

The devices discussed herein, including memory device, circuit and the like, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on".

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A memory device including a system for adaptively controlling a current of a memory cell, comprising:
- a detector of a voltage drop between a bit line and a word line coupled to a memory cell;
- a differential cell including a current mirror for reproducing the current crossing the memory cell on a resistive reference;
- a control circuit configured to operate on a voltage value correlated to said current crossing the memory cell;
- a feedback circuit portion for feeding to memory cell with a feedback voltage keeping constant the cell power independently from a value of the current crossing the memory cell.

2. The memory device of claim 1, wherein said resistive reference has a resistance value smaller than an electrical resistance of the memory cell.

3. The memory device of claim 1, wherein said control circuit includes at least a comparator having an output coupled to a MOS transistor coupled to a further comparator for feeding said feedback voltage to the memory cell.

4. The memory device of claim 3, further including a voltage reference node coupled to a terminal of the MOS transistor and to one terminal of said resistive reference.

5. The memory device of claim 3, wherein said MOS transistor is configured to operate in the linear region.

6. The memory device of claim 3, wherein in operation said MOS transistor has a voltage drop between the conduction terminals corresponding to a voltage value on said resistive reference crossed by the current crossing the memory cell.

7. The memory device of claim 1, the system for adaptively controlling the current is coupled to a tile of a memory array, further comprising a second system for adaptively controlling the current of a second memory cell coupled to a second tile of the memory array.

8. The memory device of claim 1, wherein the memory cell is a 3D memory cell.

9. The memory device of claim 1, wherein the feedback circuit portion includes at least an operation amplifier configured to receive an input from said control circuit and to provide as output a feedback voltage applied to a control terminal of a MOS transistor.

10. A system for adaptively controlling a reset current of a memory cell, comprising:

a mirror circuit with one branch coupled with a top electrode of the memory cell and the other branch coupled with one end of a resistive reference, and wherein a bottom electrode of the memory cell is coupled to a reference potential, the other end of the resistive reference is provided with a first electric potential;

a control circuit; and a feedback circuit for feeding an electric potential to the top electrode of the memory cell.

11. The system of claim 10, wherein the control circuit includes a current source for providing an input current to a drain of a first NMOS transistor and providing said electric potential to a gate of the first NMOS transistor configured to operate in a linear region.

12. The system of claim 10, wherein the mirror circuit is configured to replicate the reset current of the memory cell to the resistive reference.

13. The system of claim 10, wherein the mirror circuit is part of a differential cell including also the resistive reference and having an output coupled to said control circuit.

14. The system of claim 10, wherein said control circuit further includes:

a current source;

a first operational amplifier having a first input coupled with the one end of the resistive reference, a second input coupled with the drain of the first NMOS transistor, and an output coupled with a gate of a switching transistor;

the switching transistor having a drain coupled with an output of the current source and a source coupled with the second input of the first operational amplifier; and a second operational amplifier having a first input coupled with the output of the current source, a second input to be biased by an electric potential, and an output coupled with the gate of the first NMOS transistor.

15. The system of claim 14, wherein the first operational amplifier is configured to provide the second electric potential to the drain of the first NMOS transistor.

16. The system of claim 14, wherein the feedback circuit includes a second operational amplifier with a first input coupled with a terminal of the first NMOS transistor through said switching transistor, a second input kept to a reference potential and an output coupled with the top electrode of the memory cell through a third operational amplifier and to the gate of the first NMOS transistor.

17. The system of claim 16, wherein the second operational amplifier is configured to provide said electric potential as a feedback voltage to the top electrode of the memory cell.

18. The system of claim 10, configured to keep a power in the memory cell substantially constant during reset operations of the memory cell.

19. The system of claim 10, wherein the top electrode of the memory cell is coupled with a word line, and the bottom electrode of the memory cell is coupled with a bit line, or vice-versa.

20. A method for adaptively controlling a current of a memory cell, comprising:

applying a voltage difference between a bit line and a word line coupled to a memory cell;

mirroring on a resistive reference a value of the reset current crossing the memory cell;

comparing a voltage value on said resistive reference with a reference value related to the reset current crossing the memory cell;

supplying to the memory cell a feedback voltage according to a result of the comparing.

21. The method of claim 20, wherein a resistive value of said resistive reference is smaller that a resistive value of the memory cell.

22. The method of claim 20, wherein a cell power is kept constant independently from the reset current crossing the memory cell.

23. The method of claim 20, wherein the phase of supplying to the memory cell a feedback voltage comprises feeding an extra current according to a result of the comparing.

24. A method for adaptively controlling a current of a memory cell, comprising:

measuring the current flowing through the memory cell, and wherein a bottom electrode of the memory cell is coupled to a reference potential;

providing the current to one end of a resistive reference having a constant resistance smaller than an electrical resistance of the memory cell, and wherein another end of the resistive reference is provided with a first electric potential;

providing a second electric potential on the one end of the resistive reference to a drain of a N-Channel Metal-Oxide-Semiconductor (NMOS) transistor, and wherein a gate of the NMOS transistor is provided with a feedback electric potential, and a source of the NMOS transistor is provided with the first electric potential;

injecting an input current to the drain of the NMOS transistor; and feeding the feedback electric potential back to a top electrode of the memory cell.

25. The method of claim 24 wherein the NMOS transistor is operated in a linear region, and the input current is equal to a drain current of the NMOS transistor in the linear region.

26. The method of claim 24, wherein the current of the memory cell is a reset current and a power in the memory cell is kept substantially constant during reset operations of the memory cell.

27. The method of claim 24, wherein the top electrode of the memory cell is coupled with a word line, and the bottom electrode of the memory cell is coupled with a bit line, or vice-versa.

28. The method of claim 24, wherein the current of the memory cell increases as the electrical resistance of the memory cell decreases.

* * * * *

UNITED STATES PATENT AND TRADEMARK OFFICE

CERTIFICATE OF CORRECTION

PATENT NO. : 11,823,737 B2
APPLICATION NO. : 16/971053
DATED : November 21, 2023
INVENTOR(S) : Marco Sforzin and Umberto Di Vincenzo It is certified that error appears in the above-identified patent and that said Letters Patent is hereby corrected as shown below:

On the Title Page

In the title, item (54) and in the Specification, Column 1, Lines 1-3, please delete "ADAPTIVE CONTROL TO ACCESS CURRENT OF MEMORY CELL DESCRIPTION" and insert --ADAPTIVE CONTROL TO ACCESS CURRENT OF MEMORY CELL--, therefor.

Signed and Sealed this
Twentieth Day of February, 2024

Katherine Kelly Vidal

Katherine Kelly Vidal
*Director of the United States Patent and Trademark Office*